US012717981B2

(12) United States Patent
Royero

(10) Patent No.: US 12,717,981 B2
(45) Date of Patent: Aug. 25, 2026

(54) SYSTEMS AND METHODS FOR MAPPING COVERAGE OF MONITORING STATIONS

(71) Applicant: Pano AI, Inc., San Francisco, CA (US)

(72) Inventor: John Robinson Royero, East Palo Alto, CA (US)

(73) Assignee: Pano AI, Inc., San Francisco, CA (US)

( * ) Notice: Subject to any disclaimer, the term of this patent is extended or adjusted under 35 U.S.C. 154(b) by 0 days.

(21) Appl. No.: 19/342,145

(22) Filed: Sep. 26, 2025

(65) Prior Publication Data

US 2026/0093858 A1 Apr. 2, 2026

Related U.S. Application Data

(60) Provisional application No. 63/700,413, filed on Sep. 27, 2024.

(51) Int. Cl.
*G06F 30/13* (2020.01)

(52) U.S. Cl.
CPC .................................... *G06F 30/13* (2020.01)

(58) Field of Classification Search
CPC ....................................................... G06F 30/13
USPC ............................................................. 703/1
See application file for complete search history.

(56) References Cited

U.S. PATENT DOCUMENTS 6,163,749 A * 12/2000 McDonough ........ G09B 29/106 701/461
7,466,244 B2 * 12/2008 Kimchi .............. G01C 21/3673 340/8.1
7,920,072 B2 * 4/2011 Smith .................. G09B 29/007 340/995.1
8,234,105 B1 * 7/2012 Aldrich ............... G06F 11/3684 703/22
8,843,309 B2 * 9/2014 Kimchi .................. G06Q 30/02 701/437
8,934,008 B2 * 1/2015 Rudin ....................... G06T 7/30 348/135

(Continued)

OTHER PUBLICATIONS

Han et al. (Camera planning for area surveillance: A new method for coverage inference and optimization using Location-based Service data, Computers, Environment and Urban Systems, 2019, pp. 1-15) (Year: 2019).*

(Continued)

*Primary Examiner* — Iftekhar A Khan
(74) *Attorney, Agent, or Firm* — Foley & Lardner LLP

(57) ABSTRACT

The solutions provide simulated mapping coverage of monitoring stations based on topography data and modeling. A system can identify structures on which to mount camera systems to monitor an asset in a region. The system can determine, based on locations of structures input into a topography model of the region, respective coverage areas associated with the candidate structures. The system can execute a simulation using the respective coverage areas of each of the candidate structures to determine a plurality of candidate coverages of the assets. The system can select, from the plurality of candidate structures, based on the simulation and a set of criteria, a set of structures corresponding to a selected coverage of the plurality of candidate coverages. The system can transmit, for presentation, data representing the set of structures and the respective coverage areas associated with each of the structures of the structure set forming the selected coverage.

19 Claims, 8 Drawing Sheets

(56) References Cited

U.S. PATENT DOCUMENTS

| | | | | |
|---|---|---|---|---|
| 9,262,048 | B1 | 2/2016 | Brown et al. | |
| 9,871,998 | B1 * | 1/2018 | Curlander | G06V 20/54 |
| 10,959,109 | B1 * | 3/2021 | Liu | G06N 3/0464 |
| 11,106,911 | B1 * | 8/2021 | Fathi | G05D 1/689 |
| 11,204,858 | B1 * | 12/2021 | Barash | G06F 8/71 |
| 11,741,703 | B2 * | 8/2023 | Fathi | G06V 20/176 382/154 |
| 11,868,919 | B1 * | 1/2024 | Zhang | G06Q 10/087 |
| 12,126,917 | B1 * | 10/2024 | Shemet | G06F 16/71 |
| 12,140,445 | B1 * | 11/2024 | Akhtar | G01C 21/3492 |
| 12,266,018 | B1 * | 4/2025 | Miller | G06Q 10/067 |
| 12,272,089 | B2 * | 4/2025 | Kastner | G06T 7/70 |
| 2006/0041375 | A1 * | 2/2006 | Witmer | G01C 15/00 701/532 |
| 2006/0241860 | A1 * | 10/2006 | Kimchi | G06Q 30/0275 340/995.14 |
| 2007/0210937 | A1 * | 9/2007 | Smith | G06Q 30/02 340/995.1 |
| 2007/0273558 | A1 * | 11/2007 | Smith | G08G 1/0962 340/995.1 |
| 2010/0118025 | A1 * | 5/2010 | Smith | G06Q 30/02 345/418 |
| 2011/0151864 | A1 * | 6/2011 | Byun | H04W 40/16 455/445 |
| 2012/0233000 | A1 * | 9/2012 | Fisher | G06F 16/58 705/14.71 |
| 2017/0046012 | A1 * | 2/2017 | Han | G08B 13/19682 |
| 2017/0243069 | A1 * | 8/2017 | Shen | G06V 20/56 |
| 2017/0270612 | A1 * | 9/2017 | Howe | G06V 20/176 |
| 2018/0328745 | A1 * | 11/2018 | Nagy | G01C 21/3848 |
| 2019/0238800 | A1 * | 8/2019 | Chuang | G08B 13/19619 |
| 2020/0082168 | A1 * | 3/2020 | Fathi | G06T 7/521 |
| 2020/0352082 | A1 * | 11/2020 | Maeder | A01B 69/008 |
| 2023/0095500 | A1 * | 3/2023 | Cheng | G06T 7/74 348/143 |
| 2023/0139072 | A1 * | 5/2023 | Haas | G01C 21/3815 701/26 |
| 2023/0177225 | A1 * | 6/2023 | Mavanoor | G06F 30/20 703/1 |
| 2023/0232186 | A1 | 7/2023 | Kjaldgaard et al. | |
| 2024/0147252 | A1 * | 5/2024 | Qiu | H04W 24/10 |
| 2024/0161241 | A1 * | 5/2024 | Sokeila | G06V 10/761 |
| 2024/0174242 | A1 * | 5/2024 | Schaaf | B60W 50/0205 |
| 2024/0212341 | A1 * | 6/2024 | Fathi | G06T 7/0004 |
| 2024/0331349 | A1 | 10/2024 | Wajjala | |

OTHER PUBLICATIONS

Starek et al. (Viewshed simulation and optimization for digital terrain modelling with terrestrial laser scanning, International Journal of Remote Sensing 2020, pp. 6410-6426) (Year: 2020).*

International Search Report Issued in PCT Application No. PCT/US2025/048240 dated Dec. 12, 2025.

* cited by examiner

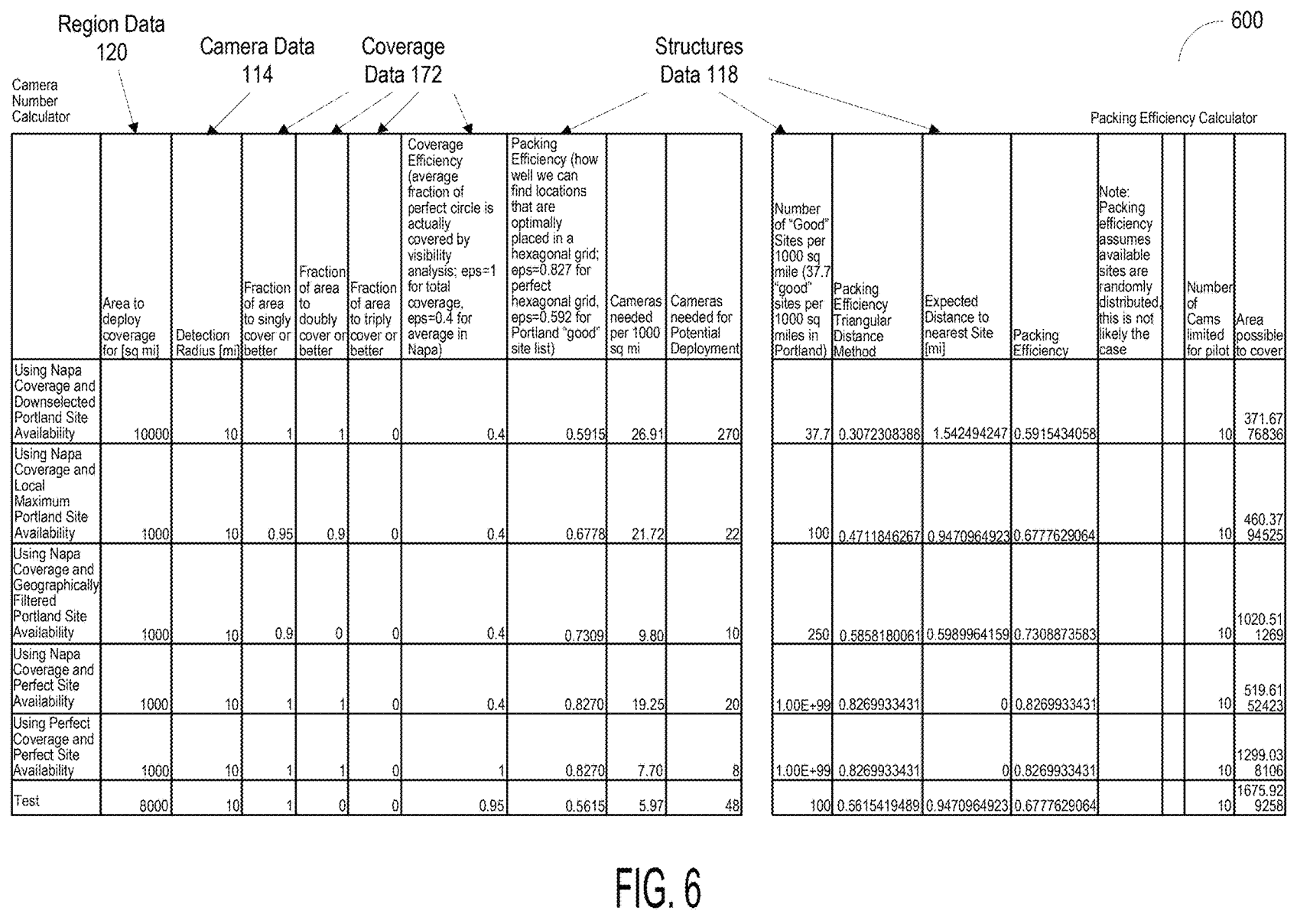

Camera Number Calculator

| | Area to deploy coverage for [sq mi] | Detection Radius [mi] | Fraction of area to singly cover or better | Fraction of area to doubly cover or better | Fraction of area to triply cover or better | Coverage Efficiency (average fraction of perfect circle is actually covered by visibility analysis; eps=1 for total coverage, eps=0.4 for average in Napa) | Packing Efficiency (how well we can find locations that are optimally placed in a hexagonal grid; eps=0.827 for perfect hexagonal grid, eps=0.592 for Portland "good" site list) | Cameras needed per 1000 sq mi | Cameras needed for Potential Deployment |
|---|---|---|---|---|---|---|---|---|---|
| Using Napa Coverage and Downselected Portland Site Availability | 10000 | 10 | 1 | 1 | 0 | 0.4 | 0.5915 | 26.91 | 270 |
| Using Napa Coverage and Local Maximum Portland Site Availability | 1000 | 10 | 0.95 | 0.9 | 0 | 0.4 | 0.6778 | 21.72 | 22 |
| Using Napa Coverage and Geographically Filtered Portland Site Availability | 1000 | 10 | 0.9 | 0 | 0 | 0.4 | 0.7309 | 9.80 | 10 |
| Using Napa Coverage and Perfect Site Availability | 1000 | 10 | 1 | 1 | 0 | 0.4 | 0.8270 | 19.25 | 20 |
| Using Perfect Coverage and Perfect Site Availability | 1000 | 10 | 1 | 1 | 0 | 1 | 0.8270 | 7.70 | 8 |
| Test | 8000 | 10 | 1 | 0 | 0 | 0.95 | 0.5615 | 5.97 | 48 |

Packing Efficiency Calculator

| Number of "Good" Sites per 1000 sq mile (37.7 "good" sites per 1000 sq miles in Portland) | Packing Efficiency Triangular Distance Method | Expected Distance to nearest Site [mi] | Packing Efficiency | Note: Packing efficiency assumes available sites are randomly distributed, this is not likely the case | | Number of Cams limited for pilot | Area possible to cover |
|---|---|---|---|---|---|---|---|
| 37.7 | 0.3072308388 | 1.542494247 | 0.5915434058 | | | 10 | 371.6776836 |
| 100 | 0.4711846267 | 0.9470964923 | 0.6777629064 | | | 10 | 460.3794525 |
| 250 | 0.5858180061 | 0.5989964159 | 0.7308873583 | | | 10 | 1020.511269 |
| 1.00E+99 | 0.8269933431 | 0 | 0.8269933431 | | | 10 | 519.6152423 |
| 1.00E+99 | 0.8269933431 | 0 | 0.8269933431 | | | 10 | 1299.038106 |
| 100 | 0.5615419489 | 0.9470964923 | 0.6777629064 | | | 10 | 1675.929258 |

FIG. 6

SYSTEMS AND METHODS FOR MAPPING COVERAGE OF MONITORING STATIONS

CROSS-REFERENCE TO RELATED APPLICATION

This application claims the benefit of priority under 35 U.S.C. § 119(e) to U.S. Provisional Patent Application No. 63/700,413, filed Sep. 27, 2024, entitled "Systems and Methods for Mapping Coverage of Monitoring Stations," which is hereby incorporated by reference herein in its entirety for all purposes.

TECHNICAL FIELD

The present disclosure relates generally to mapping coverage of monitoring stations based on simulated data.

BACKGROUND

Image capture systems can be used for monitoring and identification of items, events or incidents. Applications can extend to observation of incidents over broad regions or areas. Collecting and processing captured images can be implemented using remote systems and functions, depending on the applications and design.

SUMMARY

The technical solutions described in this disclosure are directed to the mapping and selection of monitoring stations based on simulated coverage of candidate stations using topographical data. When selecting structures to serve as monitoring stations in a region, various factors can be considered, including the types and locations of assets to be monitored, the region's topography or size, objects or field-of-view obstructions, and the number of candidate structures available. Identifying the optimal combined coverage from a set of candidate structures can be challenging and resource-intensive, as the computational resources used to determine the combined coverage of each combination can be substantial. Moreover, the number of combinations to be computed can grow exponentially with the number of candidate structures, multiplying the computational challenge. Meanwhile, calculating the coverage of a monitored area without topographical data (e.g., obstructions or terrain changes) can lead to inaccurate and unreliable determinations, while evaluating all possible candidate structure coverage combinations without any criteria or constraints can be computationally impractical. The technical solutions in this disclosure address these challenges by using topography models to reliably select structures that provide optimal topographical coverage given specific criteria or constraint limitations, thereby conserving computational resources and improving the system's efficiency.

In one aspect, the present solution relates to a system. The system can include one or more processors coupled with memory. The one or more processors can be configured to identify candidate structures on which to mount camera systems to monitor one or more assets in a region of interest. The one or more processors can be configured to determine, based on locations of the candidate structures input into a topography model of the region of interest, respective coverage areas associated with each of the candidate structures. The one or more processors can be configured to execute a simulation using the respective coverage areas of each of the candidate structures to determine a plurality of candidate coverages of the one or more assets. The one or more processors can be configured to select, from the plurality of candidate structures, based on the simulation and a set of criteria, a set of structures corresponding to a selected coverage of the plurality of candidate coverages. The one or more processors can be configured to transmit, for presentation, data representing the set of structures and the respective coverage areas associated with each of the structures of the set of structures forming the selected coverage.

The one or more processors can be configured to identify, from the candidate structures, a plurality of tower structures having respective coverage areas that at least partly overlap with the one or more locations of the one or more assets. The one or more processors can be configured to select, from the plurality of tower structures, the set of structures based at least on an amount of overlap between each of the set of structures and the one or more locations.

The one or more processors can be configured to identify, from the candidate structures, a candidate structure having a base of the candidate structure located at an elevation and a height of the candidate structure, above the base, at which to mount a camera system of the camera systems to monitor an asset of the one or more assets. The one or more processors can be configured to determine a coverage area of the candidate structure based on a location of the candidate structure, the elevation, and the height input into the topography model. The one or more processors can be configured to execute the simulation using the coverage area of the candidate structure.

The one or more processors can be configured to verify the one or more assets and the one or more locations of the candidate structures using one or more data sources, the one or more data sources. The one or more data sources can include at least one of: a satellite data, a map, a video, data on the one or more assets, licensing information and a result from an internet search corresponding to the region of interest.

The one or more processors can be configured to determine, using the topography model and elevations of the locations of the candidate structures, the respective coverage areas as captured by the camera systems mounted on each of the candidate structures. The data to be transmitted for presentation via a user interface can include a map of the region of interest, the map identifying one or more locations of the set of structures and the selected coverage to be displayed via the user interface. The data to be transmitted for presentation can include a table referencing information on the set of structures and information on the selected coverage.

The one or more processors can be configured to receive a request to determine the selected coverage based on a subset of the candidate structures and one or more constraints. The one or more processors can be configured to generate the data for transmission for presentation according to the subset of the candidate structures and the one or more constraints.

The set of criteria includes one or more of: a number of structures in the set of structures, locations of the candidate structures, a number of the one or more assets, locations of the one or more assets, one or more portions of the region of interest, one or more locations with associated with a fire hazard or one or more locations associated with a population density within the region of interest. The one or more processors can be configured to compute a score corresponding to an amount of area of the one or more assets covered by the selected coverage. The one or more processors can be configured to transmit, for presentation, the score.

The one or more processors can be configured to identify one or more constraints for the set of structures. The one or more constraints can correspond to at least one of: a maximum number of structures to include in the set of structures, a location of a structure of the set of structures or a threshold value for the candidate coverage by the set of structures. The one or more processors can be configured to generate a plurality of candidate sets of structures for which to evaluate the plurality of candidate coverages. Each candidate set of structures can include a different subset of the candidate structures. The one or more processors can be configured to select, based on the simulation of the plurality of candidate sets of structures, the set of structures corresponding to the selected coverage.

The one or more processors can be configured to overlay, onto a map of the region of interest displayed in a user interface, the data representing the set of structures, the one or more assets and at least one of a fire hazard distribution within the region of interest or a population density distribution within the region of interest.

An aspect of the technical solutions is directed to a method. The method can include one or more processors coupled with memory identifying candidate structures on which to mount camera systems to monitor one or more assets in a region of interest. The method can include the one or more processors determining, based on locations of the candidate structures input into a topography model of the region of interest, respective coverage areas associated with each of the candidate structures. The method can include the one or more processors executing, a simulation using the respective coverage areas of each of the candidate structures to determine a plurality of candidate coverages of the one or more assets. The one or more processors can include selecting, from the plurality of candidate structures, based on the simulation and a set of criteria, a set of structures corresponding to a selected coverage of the plurality of candidate coverages. The one or more processors can include transmitting, for presentation, data representing the set of structures and the respective coverage areas associated with each of the structures of the set of structures forming the selected coverage.

The method can include identifying, by the one or more processors, from the candidate structures, a plurality of tower structures having respective coverage areas that at least partly overlap with the one or more locations of the one or more assets. The method can include selecting, by the one or more processors, from the plurality of tower structures, the set of structures based at least on an amount of overlap between each of the set of structures and the one or more locations.

The method can include identifying, by the one or more processors, from the candidate structures, a candidate structure having a base of the candidate structure located at an elevation and a height of the candidate structure, above the base, at which to mount a camera system of the camera systems to monitor an asset of the one or more assets. The method can include determining, by the one or more processors, a coverage area of the candidate structure based on a location of the candidate structure, the elevation, and the height input into the topography model. The method can include executing, by the one or more processors, the simulation using the coverage area of the candidate structure.

The method can include verifying, by the one or more processors, the one or more assets and the one or more locations of the candidate structures using one or more data sources, the one or more data sources including at least one of: a satellite data, a map, a video, data on the one or more assets, licensing information and a result from an internet search corresponding to the region of interest.

The method can include receiving, by the one or more processors, a request to determine the selected coverage based on a subset of the candidate structures and one or more constraints. The method can include generating, by the one or more processors, the data for transmission for presentation according to the subset of the candidate structures and the one or more constraints.

The method can include identifying, by the one or more processors, one or more constraints for the set of structures, the one or more constraints corresponding to at least one of: a maximum number of structures to include in the set of structures, a location of a structure of the set of structures or a threshold value for the candidate coverage by the set of structures. The method can include generating, by the one or more processors, a plurality of candidate sets of structures for which to evaluate the plurality of candidate coverages, each candidate set of structures including a different subset of the candidate structures. The method can include selecting, by the one or more processors, based on the simulation of the plurality of candidate sets of structures, the set of structures corresponding to the selected coverage.

An aspect of the technical solutions is directed to a non-transitory computer readable medium storing instructions. The instructions, when executed by one or more processors, can cause the one or more processors to identify candidate structures on which to mount camera systems to monitor one or more assets in a region of interest. The instructions, when executed by one or more processors, can cause the one or more processors to determine, based on locations of the candidate structures input into a topography model of the region of interest, respective coverage areas associated with each of the candidate structures. The instructions, when executed by one or more processors, can cause the one or more processors to execute a simulation using the respective coverage areas of each of the candidate structures to determine a plurality of candidate coverages of the one or more assets. The instructions, when executed by one or more processors, can cause the one or more processors to select, from the plurality of candidate structures, based on the simulation and a set of criteria, a set of structures corresponding to a selected coverage of the plurality of candidate coverages. The instructions, when executed by one or more processors, can cause the one or more processors to transmit, for presentation, data representing the set of structures and the respective coverage areas associated with each of the structures of the set of structures forming the selected coverage.

The instructions, when executed by one or more processors, can cause the one or more processors to identify, from the candidate structures, a plurality of tower structures having respective coverage areas that at least partly overlap with the one or more locations of the one or more assets. The instructions, when executed by one or more processors, can cause the one or more processors to select, from the plurality of tower structures, the set of structures based at least on an amount of overlap between each of the set of structures and the one or more locations.

BRIEF DESCRIPTION OF THE DRAWINGS

Aspects of the present disclosure are described in the detailed description which follows, in reference to the noted plurality of drawings by way of non-limiting examples of exemplary embodiments of the present disclosure.

FIG. 6 illustrates an example of a table corresponding to a heuristic generator for estimating the number of monitoring station sites presented via an interface.

DETAILED DESCRIPTION

Mapping and selecting candidate structures to use as monitoring stations for observing an area via camera systems can be challenging and computationally intensive. Selecting candidate structures to use as monitoring stations from a broad region of interest can involve numerous factors, such as the types and locations of assets to monitor, regional topography or size, field-of-view obstructions, physical characteristics of the candidate structures and their surrounding areas and any system criteria or constraints on the design. Given such factors, identifying the desired combined coverage from a selection of candidate structures can result in many compute intensive determinations for each combination, which can be repeated across the combinations, making the process very resource-intensive. In addition, calculating coverage area of the candidate stations without considering topographical obstructions surrounding the candidate stations, make such determinations unreliable as the coverage areas may be inaccurate. Meanwhile, evaluating all of candidate structure combinations without any limitations, constraints or criteria can exponentially increase the computational demands, making any accurate and reliable determinations impractical and energy inefficient.

The technical solutions of this disclosure overcome these and other challenges by using topography models and topographical data, along with design criteria or constraints, to reduce the computational resources used to accurately determine the desired combined topographical coverage and the corresponding set of structures. By factoring in different topographical data, the solutions can account for variations in coverage from individual structures, improving the accuracy of coverage computations. By utilizing constraints or criteria for the desired combined coverage, the technical solutions can maintain the computational accuracy, while conserving the computational resources and improving the energy efficiency of the system. In doing so, the technical solutions allow for the selection of the most suitable combination of structures to maximize coverage given the criteria and constraints, thereby improving both the accuracy and reliability, as well as the compute and the energy efficiency of the process.

Figure 1:
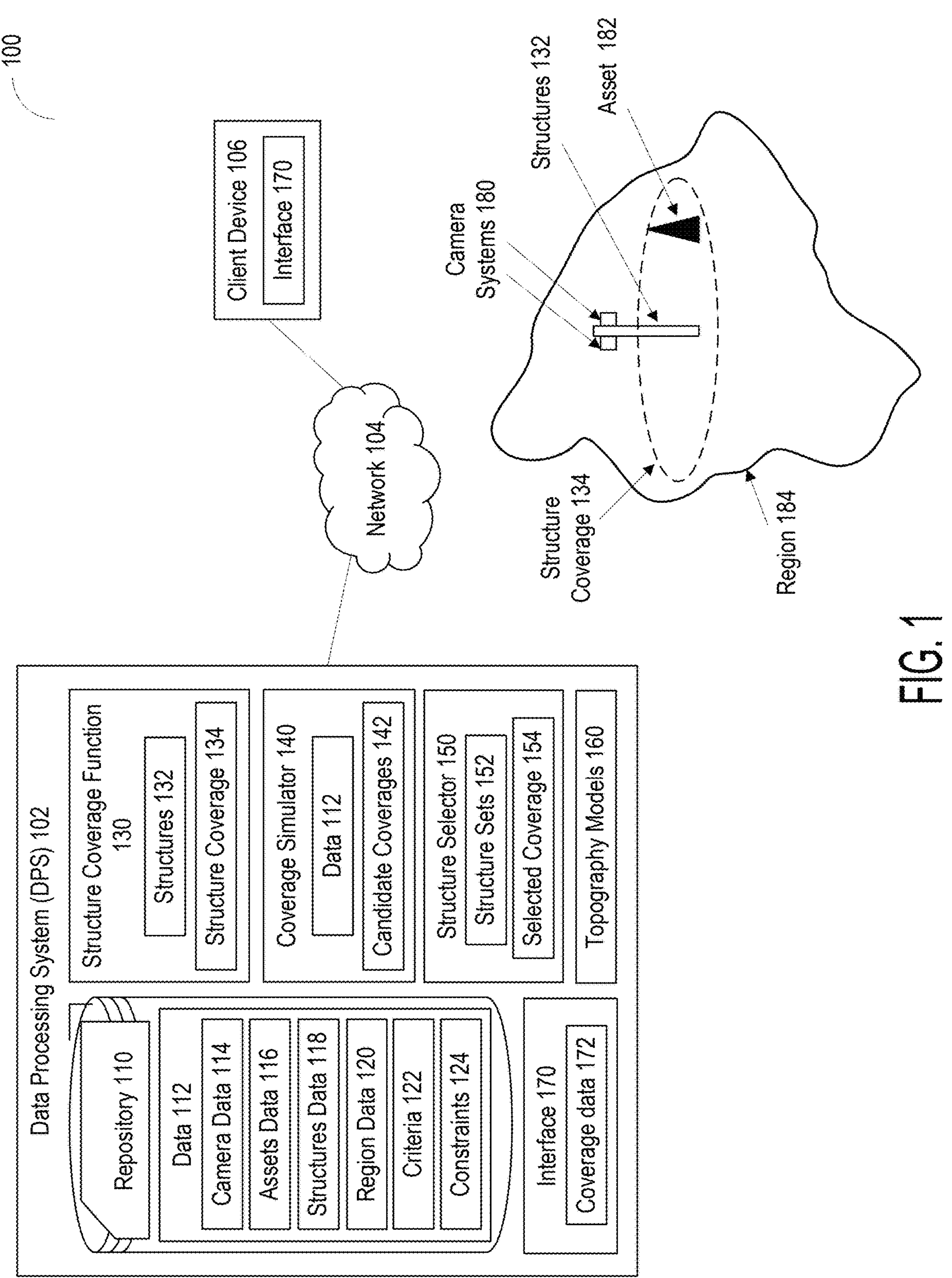
FIG. 1 is an example block diagram of a system for providing simulated mapping coverage of monitoring stations based on topography data and modeling.

FIG. 1 is an example block diagram of a system 100 for mapping area coverage based on selection of monitoring stations (e.g., structures with mounted camera systems). System 100 can be configured to determine a combined coverage from any arrangement or a set of monitoring structures (e.g., monitoring stations), based on a topography of the region in which the structures are located and other data. Example system 100 can include a data processing system (DPS) 102 that can communicate with a client device 106, via network 104. DPS 102 can include one or more of: repositories 110, structure coverage functions 130, coverage simulators 140, structure selectors 150, topography models 160 and interfaces 170. Each repository 110 can include one or more of data 112, which can include camera data 114, assets data 116, structures data 118, region data 120, criteria 122 and constraints 124.

Structure coverage function 130 can identify various candidate structures 132 (e.g., monitoring stations) and utilize topography models 160 to determine structure coverages 134 for the various candidate structures 132 from the viewpoint of the camera system 180 mounted on the structure 132. Coverage simulator 140 can utilize data 112 to simulate structure coverages 134 of the various structures 132 to determine candidate coverages 142 (e.g., combined coverage areas from various arrangements of different structures 132) for monitoring particular assets 182 in a given region 184. Structure selector 150 can select one or more structure sets 152 (e.g., selected group of structures 132 to act as monitoring stations) to provide a particular selected coverage 154. The interface 170 can display, present or transmit for presentation at remote client devices 106, any coverage data 172 that can include the selected structure set 152 and the corresponding selected coverage 154.

System 100 can include any combination of hardware and software for mapping coverage of areas based on selection of monitoring stations with mounted camera systems 180 in a region 184. System 100 can include the functionality for determining combined aerial coverage from a selection or a set of candidate structures 132 that can be converted into or used as monitoring stations by installing camera systems 180 thereon. The data processing system 102 can include or be executed on any computing device, such as a computer, a smartphone, a laptop, a server, a cloud-based service or any other computing device. The data processing system 102 of the system 100 can be configured to communicate with client devices 106 (e.g., computers, laptops or smartphones of various users accessing or utilizing data processing system 102) via network 104. System 100 can include, or be executed using, a computing system 200 (e.g., such as described in FIG. 2). Computing system 200 can be used to execute the DPS 102 on one or more processors (e.g., 210) that can be coupled with one or more memories (e.g., 215) storing any commands, instructions and/or data (e.g., 112) for executing or implementing the functionalities of the data processing system 102 or its components (e.g., structure coverage function 130, coverage simulator 140, structure selector 150, topography model 160 or interface 170).

Repository 110 can include any combination of hardware and software for storing data, such as any one or more storage devices (e.g., 225) or memory devices (e.g., 215) that can store various types of data 112. Repository 110 can include databases for organizing or arranging data storage, based on the type of data 112 or the type of data use. Repository 110 can provide access to the data 112 to any of the features or components of the data processing system 102, including any of the structure coverage function 130, coverage simulator 140, structure selector 150, topography model 160 or interface 170 for their use, functionalities or operations.

Data 112 can include any type and form of information that can be used for simulating, determining or mapping coverage from camera systems 180 mounted on one or more structures 132 (e.g., monitoring stations of a region of interest). Data 112 can include any topography data, such as data corresponding to an area or a region (e.g., data on any assets 182, structures 132 or region 184). Data 112 can include any information on camera systems 180 (e.g., their height from the base of the structure 132, or their arrangement, direction or orientation), locations or elevations of structures 132, data on the topography (e.g., contours of elevations of the region 184), information on assets 182 to be monitored (e.g., their type, value or priority, location or elevation), and any criteria 122 or constraints 124 to consider while evaluating or selecting a suitable, desired preferred or optimal structure sets 152 (e.g., a select group of structures 132 to use to provide the selected coverage 154). Data 112 can include any combination of any camera data 114, assets data 116, structures data 118, region data 120, criteria 122 or constraints 124, which can be used for operation of any of the data processing system 102 components.

Camera data 114 can include any information or data on or captured by camera systems 180. Camera data 114 can include information about locations of the camera systems 180, including their geographical location (e.g., location of a given structure 132 on which the camera system 180 is mounted or is to be mounted). Camera data 114 can include information about height from the base of the candidate structure 132 at which the camera system 180 is to be mounted. Camera data 114 can include arrangement information of the camera system 180, such as its positioning, direction, view angles of coverage (e.g., 90-degree view angle from a reference direction, or 180-degree view angle, or 270-degree view angle or 360-degree view angle). Camera data 114 can include information about the camera system 180, including the camera system's resolution, zoom (e.g., digital zoom or optical zoom), operation mode (e.g., night viewing, infra-red or visible range, as well as panoramic scanning or focused operation), or any other capabilities that can be indicative of, or corresponding to, the camera system 180 operability.

Camera system 180 can include any type and form of a camera system that can include one or more camera devices. The camera devices can include any devices for capturing and recording images or videos at any direction or view angle from the structure 132. Camera system 180 can include one or more systems of rotating camera devices, such as camera devices that can rotate or spin about their own individual axes (e.g., 90 degrees, 180 degrees, 270 degrees or 360 degrees). Camera system 180 can be configured to monitor a portion of a region 184 (e.g., region of interest), such as structure coverage 134 by rotating and taking images at different angles about the central axis of the camera system 180, such as taking five images at offsets of 36 degrees from each other each, to cover 180 degrees about an axis of a camera device. Camera system 180 can stich or combine individual images to form or generate panoramic images that can cover up to, for example, 90 degrees, 180 degrees or 360 degrees about the axis of the camera system 180. Camera system 180 can include operation modes or functionality for monitoring or detecting incidents, such as fires or presence of smoke. For instance, camera system 180 can monitor assets 182 to detect smoke or fires in the vicinity (e.g., within a predetermined range of) the assets 182, generating alarms or notifications when smoke or fire is detected in the captured images or videos.

Asset data 116 or assets data 116 can include any information or data on assets 182 to be monitored, viewed or observed by the selected structures 132 (e.g., monitoring stations). Asset data 116 can include information about the type of asset 182, its location, size and shape. Asset data 116 can include descriptions of the assets (e.g., power stations, power lines, electronic or electrical equipment, power distribution centers, enterprise facilities, residential areas or structures, or any other asset type). Asset data 116 can include information or data on the value of the asset (e.g., weight or parameter to apply for the asset 182 in determining selected coverage 154).

Asset 182 can include any object, resource, property or item that can be monitored by one or more monitoring stations (e.g., structures 132 with mounted camera systems 180). Asset 182 can include property or items of value to organizations, enterprises (e.g., corporations) or entities (e.g., towns or regions), such as power plants, corporate or government facilities, water plants or any other structures. Assets 182 can include, for example, power stations or their sub-stations, transformers, power lines and their towers, circuit breakers or power distribution circuitry, switch gear, control centers and energy storage systems. Assets 182 can include manufacturing plants, warehouses, supply chain logistics, water or waste management systems or other facilities. Assets 182 can include structures such as bridges, tunnels, and dams, as well as buildings, government or corporate facilities. Assets 182 can include corporate assets, such as server farms and data centers, cultural heritage sites, transportation hubs, such as airports or train stations, and other items or properties.

Structure data 118 or structures data 118 can include any data or information on structures 132 for potential monitoring stations, or in some embodiments, for use in mounting one or more camera systems. Structure data 118 can include information on location of structure 132 (e.g., geographical locations or coordinates), elevation data (e.g., elevation layout of the location at which the structure 132 is located) or contour shape or topography of the region of the location of the structure. Structure data 118 can include information about shape and size of the structure 132, such as its height, width, length or depth or distance from assets 182, location with respect to the assets 182. Structure data 118 can include information about the type of the structure 132 (e.g., an electrical pole, a tree, a building, a tower, or any other structure or object).

Structure 132 can include any object, item or structure on which a camera system 180 can be mounted or installed to form a monitoring station for viewing or monitoring an area. Structure 132 can include an elevated or elongate structure having a larger height than its width or length, such as an electrical power pole, a telecommunications tower, or a streetlight. Structure 132 can include building or structure rooftops, which provide a vantage point that is elevated from the surrounding ground and that can be used for mounting or installing camera systems 180 for wide-area surveillance and any associated monitoring equipment. Structures 132 can include bridges and overpasses, trees or rock formations or constructed elevated towers mounted at particular coverage locations or areas.

Region data 120 can include any information or data about a region 184. Region data 120 can include information about geography, layout or topography of a region. Region data 120 can include any combination of satellite images, maps or any other data of a terrain or an area of interest. Region data 120 can include information about elevations (e.g., hills and valleys), identify any mountains or rock formations, any valleys or any other topographical descriptions. Region data 120 can include infrastructure details, such as locations of buildings or structures that can obstruct view from a particular candidate structure 132 towards an area, including buildings, utilities, bridges or trees. Region data can include geographical coordinates of various features or items in a region 184, such as information on assets 182 (e.g., their location or distance from nearby structures 132 or other assets 182), information on structures 132 (e.g., their location or distance from assets 182 or other structures 132). Region data 120 can include climate information, such as wind, temperature and precipitation data or patterns, information on natural resources (e.g., forests, water bodies, and mineral deposits) and data on demographic information (e.g., population density, fire hazard density or data, urbanization patterns, and cultural landmarks).

Region 184 can include any geographical area, such as a city, county, state, or country. Region 184 can be defined by specific boundaries and characteristics. Region 184 can include an urban or suburban area with infrastructure of varying density (e.g., dense arrangement of buildings or population in an urban metropolis and more sparce family homes and fewer people in a suburban towns or rural areas). Region 184 can include assets 182, structure 132 that can be arranged or dispersed throughout the area. Region 184 can include buildings, transportation networks, rivers, forests, mountains and valleys. Region 184 can include coastal areas including beaches and ports, as well as mountainous areas with rugged terrain, forests, and recreational sites. Region 184 can include industrial zones, residential neighborhoods, and commercial districts, having any number or concentration of assets 182 and structures 132 of various types.

Criteria 122 can be, or include any factors that prioritize, indicate or facilitate an optimal selection of structures 132 to form a structure set 152 providing a desired or optimal combined selected coverage 154. Criteria 122 can include any parameters or values, including weights, for scaling, favoring or weighting particular factors in determining structure set 152 over other factors. For instance, criteria 122 can include the number of structures 132 to include in a structure set 152 or locations of candidate structures 132 to include in the analysis or selection process. Criteria 122 can include assets data 116, such as the number or locations of the assets 182 that are to be monitored, value or prioritization of particular assets 182 over others. facilities. Criteria 122 can include camera data 114, such as information on particular camera systems 180, their availability, preference or suitability for particular type of monitoring (e.g., night vision cameras or infrared cameras for night-time monitoring, or monitoring of fires or flames). Criteria 122 can include region data 120, such as information on any region 184 (e.g., region of interest), such as zones with high fire hazards (e.g., areas with fire hazard factors above a fire hazard threshold) or areas with increased or significant population density (e.g., areas with population density above a population density threshold).

Constraints 124 can include any limits, or constraints to apply in the selection of the structures sets 152 or selected coverage 154. Constraints 124 can include, for example, a minimum or a maximum number of structures 132 to include in the set of structures (e.g., structure sets 152) or a minimum or a maximum density of structures 132 per a unit of area (e.g., square kilometer or a square mile). Constraints 124 can include a set or predetermined locations or regions of structure 132 to include in the set of structures (e.g., structure sets 152). Constraints 124 can include a threshold value for the candidate coverage 142 (e.g., a minimum or maximum number of structures 132) to include in generating candidate coverages 142 while determining the selected structure set 152 or the selected coverage 154.

Structure coverage function 130 can include any combination of hardware and software for identifying candidate structure 132 on which to mount camera systems 180 to monitor one or more assets 182 in a region 184. Structure coverage function 130 can identify any potential monitoring stations (e.g., candidate structures 132) in a region 184 (e.g., region of interest) that can be utilized (e.g., via mounted camera systems 180) to view or monitor given structure coverages 134 (e.g., viewable areas from the mounted camera system's vantage point). Structure coverage function 130 can utilize, for example, a topography model 160 along with any region data 120, structures data 118, assets data 116 and camera data 114 to identify the candidate structures 132 (e.g., based on any data 112).

Structure coverage function 130 can include any functionality to determine, using topography or topology of a region 184, any one or more structure coverages 134 corresponding to or associated with various candidate structures 132. The topography or topology data of the region can include, for example a map, contour data or images of the area that can be used as the source of information for identifying candidate structures 132 and the surrounding topography. For instance, structure coverage function 130 can be configured to determine, based on locations of various candidate structures 132 input into a topography model 160, various structure coverages 134, including any coverage areas or regions that can be viewed or monitored from the given structure 132. Structure coverage function can determine, based on locations of the candidate structures 132 input into a topography model 160 of the region 184 (e.g., region of interest), any number of respective coverage areas (e.g., structure coverages 134) associated with each of the candidate structures 132 identified by the structure coverage function 130, or modeled by the topography model 160. For example, coordinates of the candidate structures 132 can be input into a map to be used by the structure coverage function 130 to determine individual structure coverages 134 for each candidate structure 132 based on the topography or topology of the area.

Structure coverage 134 can include any area that is viewable, visible or capable of being monitored by one or more camera systems 180 installed or mounted on a given structure 132. Structure coverage 134 can be mapped (e.g., on a map of a region 184) as a circular coverage when there are no obstacles to the view from the structure 132. Structure coverage 134 can be limited however by obstacles in the region 184 (e.g., from region data 120) such as buildings, trees, forests, hills or mountains or other structures or items that can preclude further visibility in a particular direction. Structure coverage 134 can have varying distances in varying directions about the central axis of the structure 132, depending on the topography or topology (e.g., hills and valleys and distances between them) of the region 184, and any intervening assets 182, structures 132 or others objects.

Topography model 160 can include any model for modeling, evaluating or determining structure coverage 134 of any structure 132 based on any data 112. For instance, topography model 160 can utilize any camera data 114, assets data 116, structures data 118, region data 120, criteria 122 or constraints 124 to model the region 184 with its features (e.g., peaks and valleys, elevations, assets 182, structures 132, obstacles or visibility) in determining structure coverage 134. For instance, an application can be utilized to gather, from a plurality of sources, information to be used by the topography model 160, including camera data 116, assets data 116, structures data 118, region data 120, criteria data 122 or constraints 124. Such an application can include an interface that can access multiple data sources and models, such as the topography data, locations of power distribution sites, power cable polls, cables and tree covers provided via satellite imagery. Topography model 160 can model a region 184 using any features or data of the region, including maps or satellite images of the region, descriptions of the features modeled or any other data 112.

Coverage simulator 140 can include any combination of hardware and software for simulating, modeling or otherwise determining one or more candidate coverages 142. A candidate coverage 142 can include any area that is covered by a combination of one or more camera systems 180 of the corresponding one or more candidate structures 132. The candidate coverage 142 can include a combined coverage area covered by a plurality of camera systems 180 from a plurality of (e.g., candidate) structures 132, given their combined structure coverages 134 (e.g., visibility areas), accounting for any obstacles to the camera systems 180.

Coverage simulator 140 can include a simulation function for simulating various selections of candidate structures 132 to create various combinations of structure coverages 134 of such candidate structures 132 to generate different candidate coverages 142. The simulation function of the coverage simulator 140 can utilize any data 112 to combine various combinations of structures 132 along with their structure coverages 134 (e.g., visibilities of the camera systems 180 from their respective vantage points) to generate candidate coverages 142 that combine such structure coverages 134 into a single combined coverage area (e.g., the candidate coverage 142 for the given combination of candidate structures 132).

Coverage simulator 140 can utilize any algorithms or schemes for combining various selections of candidate structures 132 to generate candidate coverages 142 from which the selected coverage 154 is selected. In doing so, the candidate coverage 142 can allow the technical solutions to efficiently identify the desired configuration, minimizing or reducing the compute resources and improving the energy efficiency of the system. For example, the coverage simulator 140 can perform a simulation to test multiple configurations with a constraint of a minimum percentage of coverage of the region by each candidate structure 132. In such an instance, the coverage simulator 140 can test various configurations (e.g., combinations of candidate structures 132 or candidate coverages 142) to identify the candidate coverage 142 covering the largest area or percentage of the region 184, such that each candidate structure 132 meets the minimum percentage coverage (e.g., exceeds the minimum percentage coverage). For example, the coverage simulator 140 can perform a simulation to identify the candidate structures 132 such that all of the identified assets 182 are covered and that the coverage area of the region 184 is maximized. In such an implementation, the coverage simulator 140 can focus on simulating the combinations of candidate structures 132 whose structure coverage 134 includes the assets 182, thereby eliminating from simulation those candidate structures 132 whose structure coverage 134 does not include assets 182, improving computational and energy efficiency. The coverage simulator 140 can then compute the area or percentage of the region 184 covered by all of the available combinations, facilitating the structure selector 150 in identifying the selected coverage 154 as the candidate coverage 142 having the largest area covered.

Structure selector 150 can include any combination of hardware and software for selecting a particular structure set 152 (e.g., selection of structures 132) that provides a selected coverage 154 (e.g., a candidate coverage 142 area that is selected from a plurality of candidate coverages 142). The structure selector 150 can select the structure set 152 (e.g., the selection of particular structures 132) based on their corresponding candidate coverage 142 (e.g., combination of structure coverages 134 spanning an optimal or desired area or space). Structure selector 150 can select the set of structures 132 (e.g., the structure set 152) that corresponds to a particular selected coverage 154 from the plurality of candidate coverages 142, based on the simulation (e.g., by the coverage simulator 140). The structure selector 150 can make the selection of the structure set 152 and its selected coverage 154 based on any data 112, including any set of criteria 122 or constraints 124.

Interface 170 can include any interface for presenting, displaying or providing the coverage data 172. Coverage data 172 can include any output data of the data processing system 102. Coverage data 172 can include any data on structure sets 152 (e.g., including individual data on the selected structures 132). Coverage data 172 can include any data on the selected coverage 154 (e.g., the combined coverage of the selected structures 132, or their combined structure coverages 134). Coverage data 172 can include any displaying or mapping (e.g., map, sketch, table arrangement, text output or illustration) of any camera data 114, assets data 116, structures data 118, region data 120, criteria 122 or constraints 124 corresponding to the selected structure set 152 or its selected coverage 154.

Interface 170 can include any type and form of interface, such as a graphical user interface (GUI) or any other user interface. Interface 170 can include any networking interfaces to facilitate communications via a network 104. Network 104 can include any communication wired or wireless network, such as a wireless local area network (WLAN), cellular network or the internet. Interface 170 can include the functionality to communicate, via the network 104, with other computing devices (e.g., client devices 106) and provide any coverage data 172 to such computing devices. Interface 170 can include a user interface of an application (e.g., an application of a computing device providing access to or allowing utilizing of a data processing system 102), such as a web browser to access a web page interface to utilize the functionality of the data processing system 102. Interface 170 can generate coverage data 172 in response selection of structure sets 152 and selected coverages 154.

Figure 2:
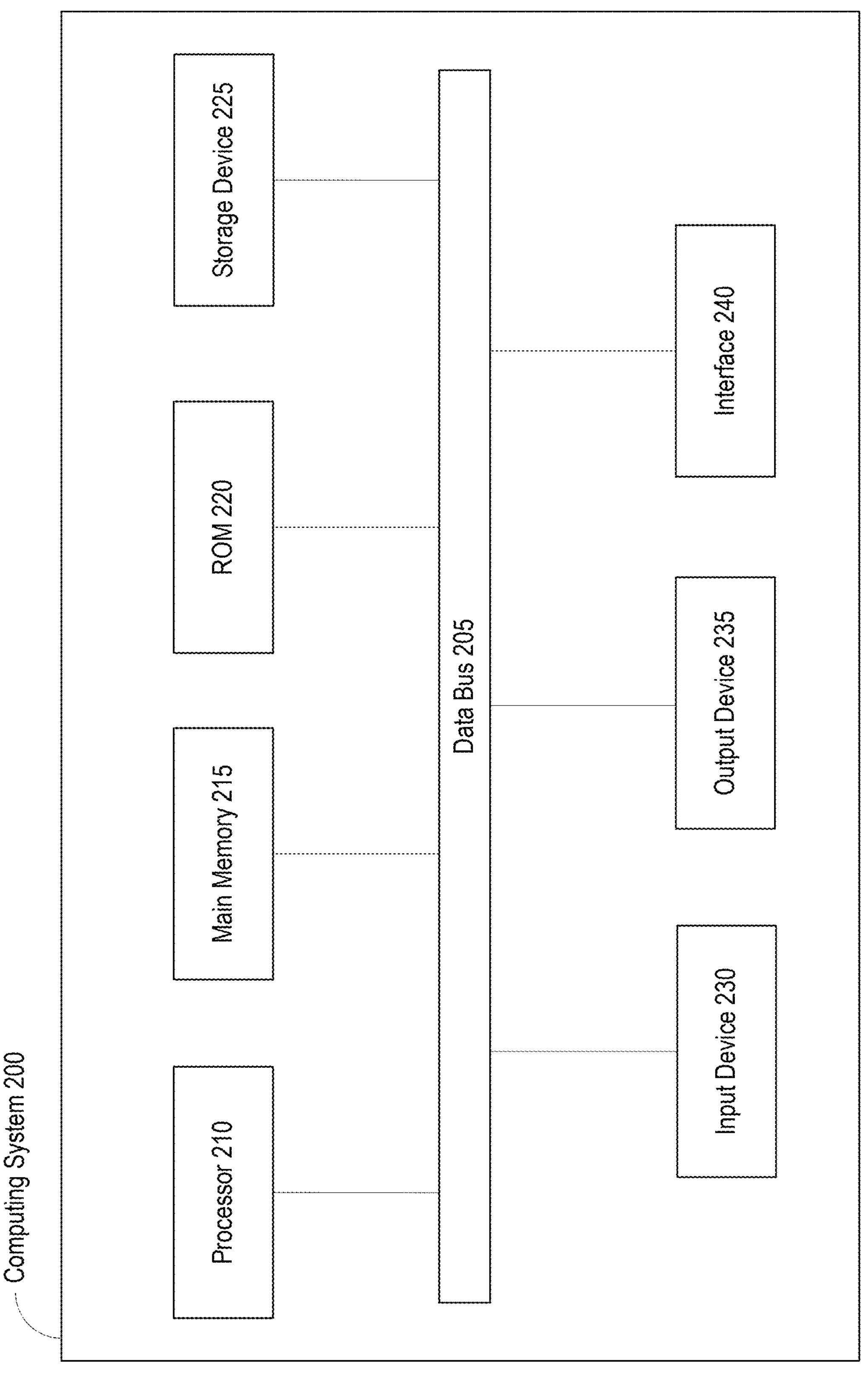
FIG. 2 illustrates an example architecture of a computing system implemented in some aspects of the present disclosure.

FIG. 2 illustrates a block diagram of an example computing system 200, also referred to as the computer system 200, which can be used to implement elements of the systems and methods described and illustrated herein. Computing system 200 can include or be used to implement any computation or functionality described herein, using for example, commands, instructions or data described herein. Computing system 200 can be included in and run any device (e.g., a server of various entities or corporations executing a data processing system, a client device 106 or any other devices communicating over a network 104). Computing system 200 can be used for operating, executing or providing any one or more of: a structure coverage function 130, a coverage simulator 140, a structure selector 150, a topography model 160 or interface 170.

Computing system 200 can include at least one bus data bus 205 or other communication component for communicating information. Computing system 200 can include at least one processor 210 or processing circuit coupled to the data bus 205 for executing instructions or processing data or information. Computing system 200 can include one or more processors 210 or processing circuits coupled to the data bus 205 for exchanging or processing data or information along with other computing systems 200. Computing system 200 can include one or more main memories 215, such as a random-access memory (RAM), dynamic RAM (DRAM) or other dynamic storage device, which can be coupled to the data bus 205 for storing information and instructions to be executed by the processor(s) 210. Main memory 215 can be used for storing information (e.g., data, computer code, commands or instructions) during execution of instructions by the processor(s) 210.

Computing system 200 can include one or more read only memories (ROMs) 220 or other static storage device 225 coupled to the bus 205 for storing static information and instructions for the processor(s) 210. Storage devices 225 can include any storage device, such as a solid-state device, magnetic disk or optical disk, which can be coupled to the data bus 205 to persistently store information and instructions.

Computing system 200 may be coupled via the data bus 205 to one or more output devices 235, such as speakers or displays (e.g., liquid crystal display or active-matrix display) for displaying or providing information to a user. Input devices 230, such as keyboards, touch screens or voice interfaces, can be coupled to the data bus 205 for communicating information and commands to the processor(s) 210. Input device 230 can include, for example, a touch screen display (e.g., output device 235). Input device 230 can include a cursor control, such as a mouse, a trackball, or cursor direction keys, for communicating direction information and command selections to the processor(s) 210 for controlling cursor movement on a display.

Computer system 200 can also include one or more interfaces 240 coupled via data buses 205. Interfaces 240 can include any physical or virtual components enabling communication between the computer system 200 and any external networks (e.g., the Internet of the network 104). Interface 245 can include a network interface providing transfer of data between the processor(s) 210, memories 215 and any external networks (e.g., network 104) to communicate with other devices on the network 104 (e.g., client devices 106, third party entities or a server or a cloud providing data processing system 102).

The processes, systems and methods described herein can be implemented by the computing system 200 in response to the processor 210 executing an arrangement of instructions contained in main memory 215. Such instructions can be read into main memory 215 from another computer-readable medium, such as the storage device 225. Execution of the arrangement of instructions contained in main memory 215 causes the computing system 200 to perform the illustrative processes described herein. One or more processors 210 in a multi-processing arrangement may also be employed to execute the instructions contained in main memory 215. Hard-wired circuitry can be used in place of or in combination with software instructions together with the systems and methods described herein. Systems and methods described herein are not limited to any specific combination of hardware circuitry and software.

Although an example computing system has been described in FIG. 2, the subject matter including the operations described in this specification can be implemented in other types of digital electronic circuitry, or in computer software, firmware, or hardware, including the structures disclosed in this specification and their structural equivalents, or in combinations of one or more of them.

Figure 3:
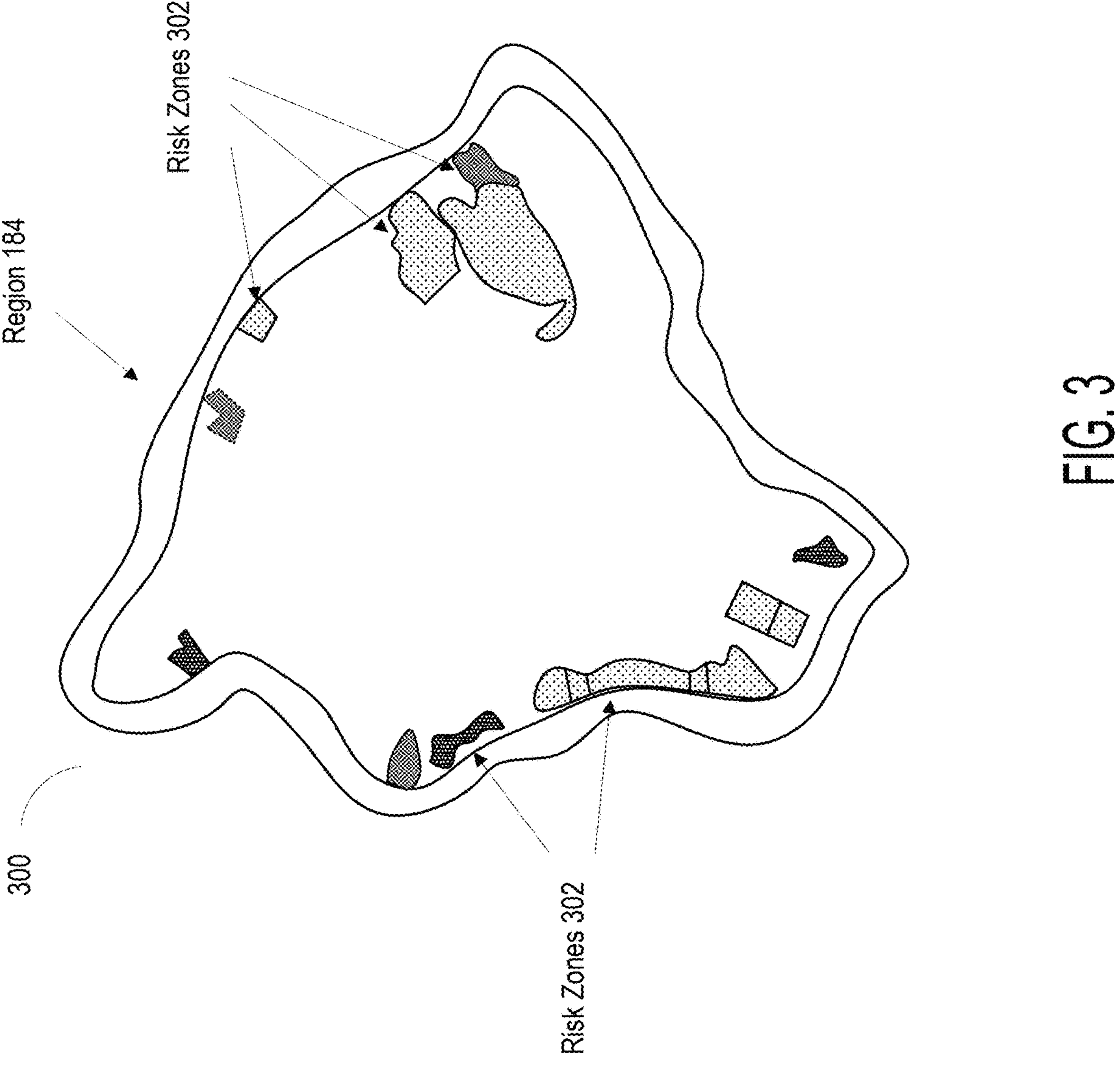
FIGS. 3-5 illustrate examples of maps of regions of interest with various topographical data that can be used for topography modeling, coverage simulations and structure set selection, in accordance with embodiments of the present solutions.

FIG. 3 illustrates an example of a map 300 that can be generated, displayed or transmitted for presentation via an interface 170. The map 300 can be created by an interface 170 (e.g., via a processor 210) based on the coverage data 172. The map 300 can include or indicate the region 184 (e.g., region of interest) that may include any number of risk zones 302, which can also be referred to as density regions 302. The region 184 can include a geographical location or an area (e.g., a representation of an island, a county or a country) that can include various assets 182 to be monitored for various types of incidents (e.g., fires, smoke, landslides or similar) via camera systems 180 mounted on structures 132 (e.g., monitoring stations).

The region 184 can be generated using region data 120 having various coordinate inputs of different parts and features of the region 184, including various assets 182 and data on incident risks, such as fire hazard densities or population densities (e.g., risk zones 302). For instance, the risk zones 302 can pertain to various types of risks and can indicate various degrees for the probability of occurrence of such risks, including risks of wildfires or risks involving population or asset densities per area. These incident related risks can be illustrated using risk zones 302 and can be utilized as criteria 122 (e.g., for prioritizing high risk regions) or constraints (e.g., for limiting the selected coverage 154 to structures 132 within higher risk zones 302). For instance, risk zones 302 can be grouped based on thresholds (e.g., a first threshold for a range of risks for a first density region 302 and a second threshold for a range of risks of a second density region 302).

Figure 4:
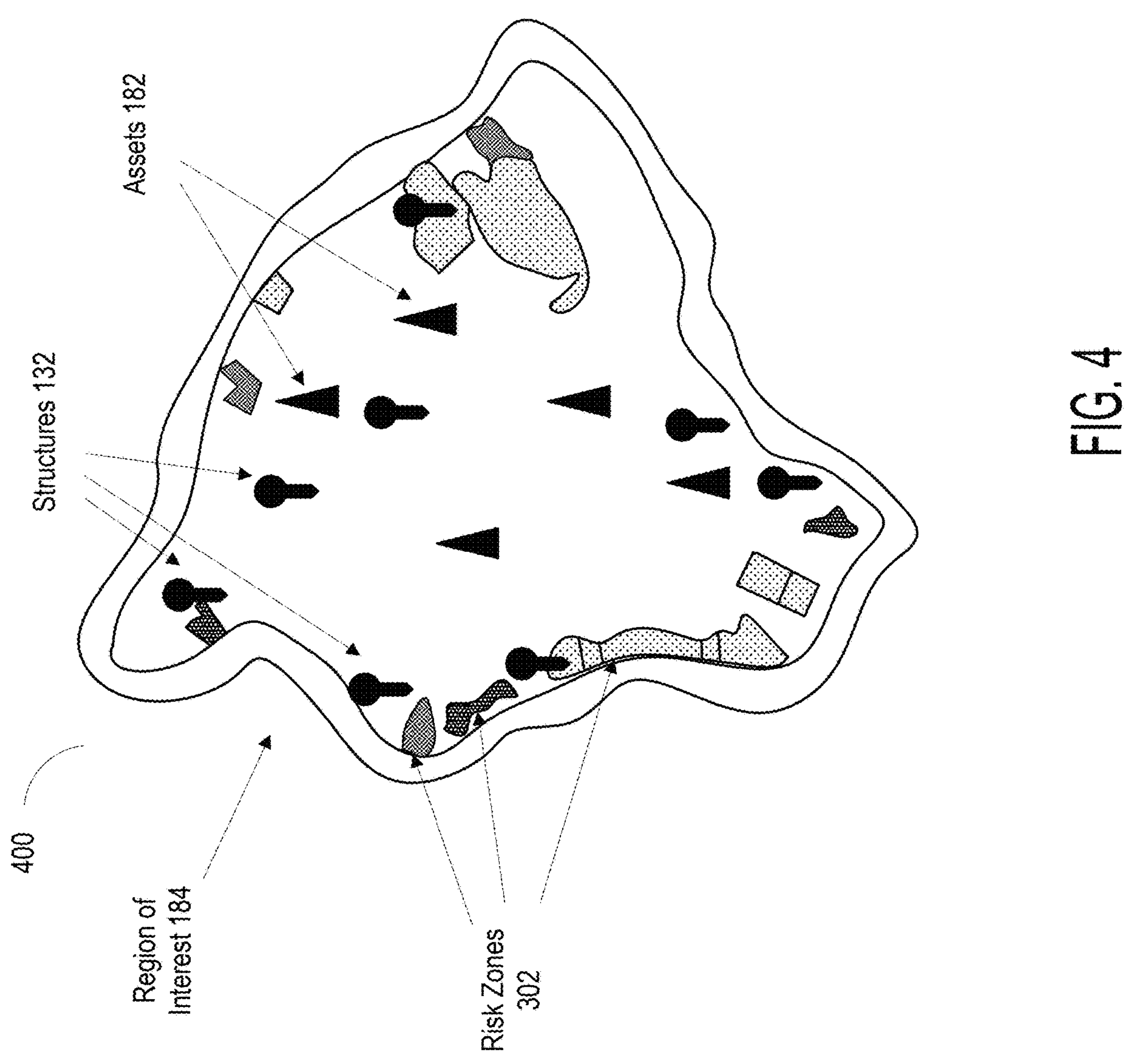

FIG. 4 illustrates another example of a map 400 that can be generated, displayed or transmitted via an interface 170. The map 400 can be created from, based on, or using the coverage data 172 and can include or be based on assets data 116, structures data 118, and region data 120. The map 400 can include, map or indicate the region 184, the risk zones 302, the structures 132, and the assets 182. The structures 132 can represent locations of potential monitoring stations within the region 184 that can be equipped with camera systems 180 and used to generate or determine individual structure coverages 134. The number and locations of the available structures 132, as represented on the map 400, can be considered by the coverage simulator as specific criteria 122 or constraints 124 while selecting the selected coverage 154 from the plurality of candidate coverages 142. The assets 182 can represent locations of priority for monitoring, such as infrastructure, property or resources. The map 400 can allow viewers to visualize the spatial relationship between the risk zones 302, the structures 132, and the assets 182 within the region 184 for purposes of coverage selection or representation.

Figure 5:
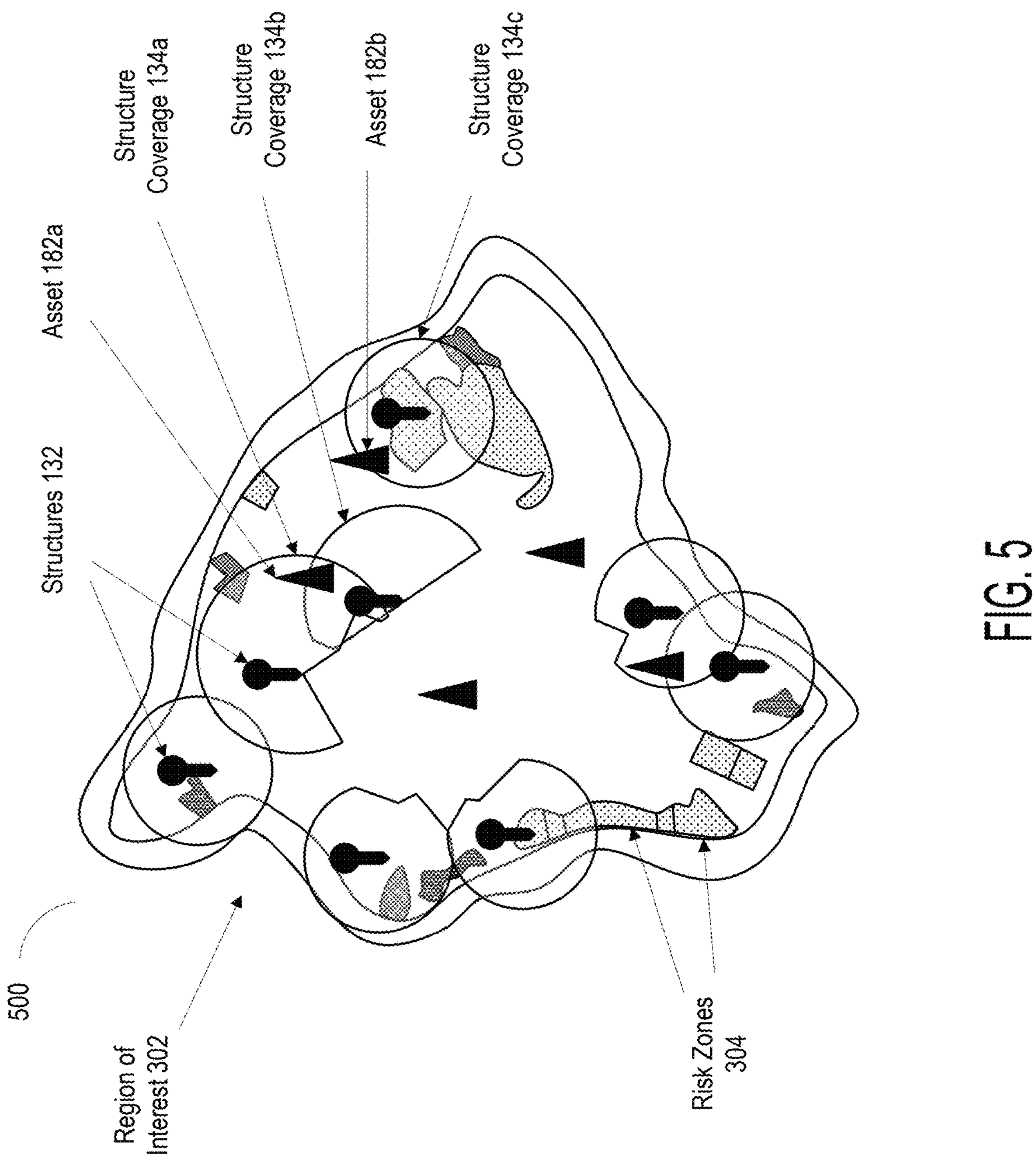

FIG. 5 illustrates another example of a map 500 that can be generated, displayed or transmitted for presentation via an interface 170. The map 500 can be created using the camera data 114, the assets data 116, the structures data 118 and the region data 120. The map 500 can include the region 184, the risk zones 302, the structures 132, assets 182*a-b*, and structure coverages 134*a-c*. The structure coverages 134 can represent the visibility from the camera systems 180 installed on the corresponding structures 132. As shown on the map 500, structures 132 can have varying visibilities based on the topography of the area, structure locations and any surrounding topography data (e.g., obstacles, buildings or hills). The structure locations can be determined from the structures data 118, and the topography of the subregion surrounding the structure can be determined using topography models 160. Structure coverages 134*a*, 134*b* and 134*c* can be selected, or grouped together, to form a selected coverage 154. The selected coverage 154 can be chosen based on various criteria 122 and constraints 124 identified by in a client request from a client device 106. The selected coverage 154 can cover asset 182*a* but only partially covers asset 182*b* (e.g., from structure 132 of the structure coverage 134*c*). The extent to which the selected coverage 154 covers incident-risk regions and assets 182 can depend on the input criteria 122 and constraints 124. The map 500 can be displayed, via the interface 170, to allow a user on a client device to visualize the selected coverage 154 and alter the criteria 122 and constraints 124 with a request to regenerate the selected coverage 154 using different sets of priorities and limitations.

FIG. 6 illustrates an example of a table 600 corresponding to a heuristic generator for estimating number of sites for an area without running through the site selection process (i.e. how many cameras/1000 sq miles). The heuristic generator can be a tool that provides quick estimates for the number of monitoring stations needed in a geographical area, using simplified calculations or rules of thumb based on factors such as population density and historical incident data to produce practical solutions efficiently. The table 600 can be generated, displayed or transmitted for presentation via an interface 170. The table 600 can include parameters used in a bulk estimate calculation of structures 132 to execute the selected coverage 154. The parameters can include various values or entries corresponding to any data 112, including region data 120, camera data 114, coverage data 172, and structures data 118. The region data 120 can include the area for which to prioritize (e.g., criteria) or demand (e.g., constraint) the coverage by a monitoring station. The camera data 114 can include the detection radius of the camera system 180, which can depend on various camera capabilities (e.g., resolution, pixel density, optical or digital zoom capabilities or similar features). The coverage data 172 can include coverage efficiency of the selected coverage 154. The coverage efficiency can include a combined visibility fraction for the structure coverages 134 of the selected coverage 154. The structures data 118 can include the likelihood of locating optimal structures 132 based on structure location and type. The data processing system can utilize these parameters to generate a selected coverage 154 that minimizes the overlap of individual structure coverages 134 such that efficiency of the selected coverage 154 is improved or such that the coverage area is maximized.

Figure 7:
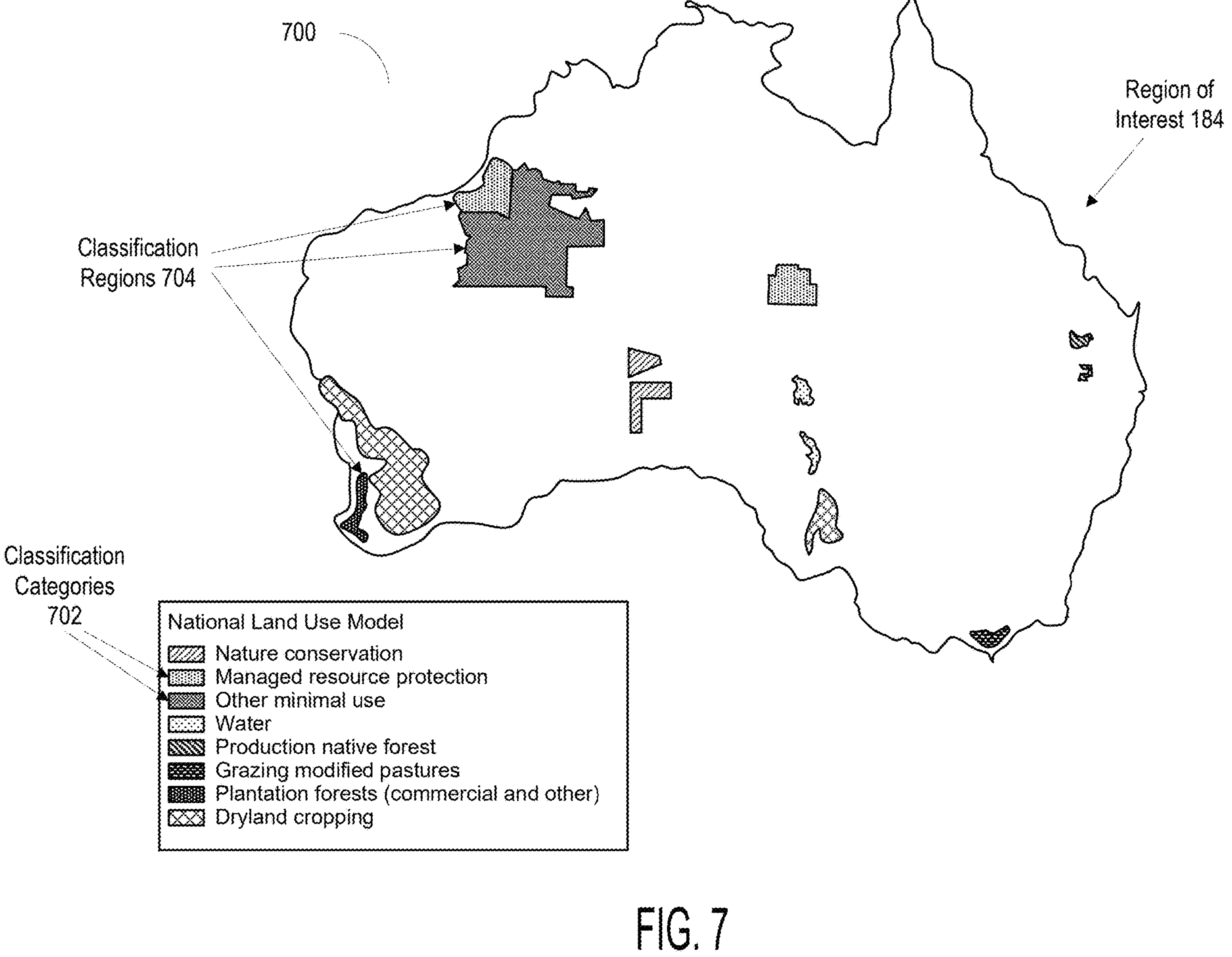
FIG. 7 illustrates an example of a map of a land model that can be used for presenting various classifications in a region of interest.

FIG. 7 illustrates an example of a map of a land model 700. The land model 700 can include a downloadable data layer to be input into the data processing system 102 as an example of a region data 120. For instance, the land model 700 can include a land use model or a land cover model. Land model types can be used depending on the incident type monitored, such as fire hazard mapping that can be mapped using fire hazard classification regions 704, risks of harm to population mapping that can be mapped using population classification regions 704, or any other type of mapping. The coverage simulator 140 can use the land model 700 to identify classification regions 704 when generating a simulation. The land model 700 can include, identify or indicate classification categories 702 within the region 184. The classification categories 702 can depend on the type of a map (e.g., fire hazard map, land use map, population density map or any other) and can include various classifications for each risk zone type. In land use example, classification categories 702 can include nature conservations, urban intensive uses, and mining and waste uses, water areas, production native forests or other land classifications. Each land use classification can be associated with a visual indicator to be portrayed on the land model 700 in corresponding risk zones 302. Classification categories 702 can be used to indicate asset density. In an example where inhabited assets are the assets 182 of interest, a classification regions 704 that is classified as an urban intensive use where population density is high can indicate high asset density. In an example where the incident type being monitored is a wildfire, a region of high risk can be a mosaic grassland in which the wildfire hazard risk potential meets a specified threshold.

Figure 8:
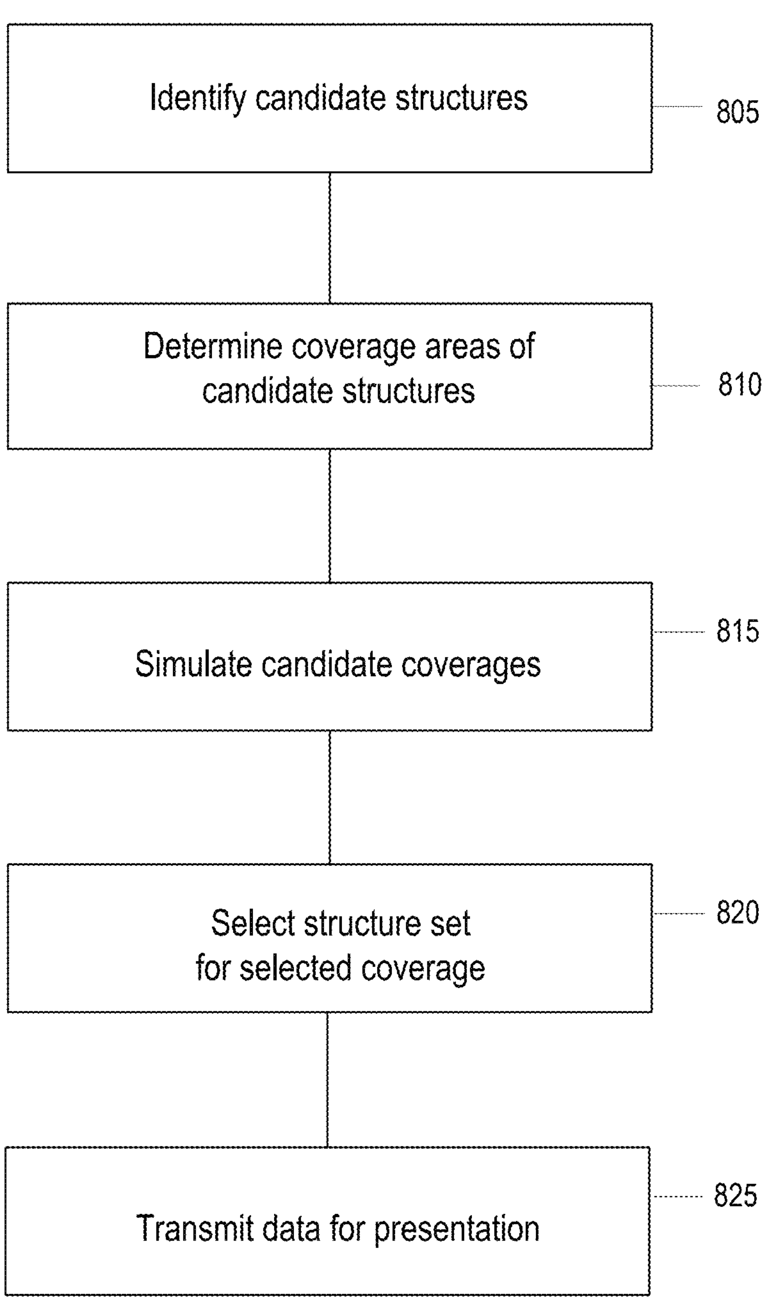
FIG. 8 is an example a process flow of a method for providing simulated mapping coverage of monitoring stations based on topography data and modeling.

FIG. 8 is an example a process flow of a method 800 for providing a mapping coverage of monitoring stations or structures. Method 800 can be implemented using the systems and components described, for example, in system 100 and using computing system 200. Method 800 can include acts 805-825. Acts 805-825 can be implemented in any arrangement or order. For instance, at 805, a data processing can identify candidate structures. At 810, the data processing system can determine coverage areas of the candidate structures. At 815, the data processing system can simulate candidate coverages for the candidate structures. At 820, the data processing system can select a structure set for a selected coverage. At 825, the data processing system can transmit data for presentation. Method 800 can also include other arrangements or ordering of actions. For instance, method 800 can start by identifying candidate structures and then simulate coverage areas of candidate structures. The method can then compute coverage and suitability scores (e.g., based on the simulation), and then select structure set for selected coverage and transmit data for presentation.

At 805, a data processing can identify candidate structures. The method can include the data processing system utilizing a structure coverage function identifying candidate structures on which to mount camera systems to monitor one or more assets in a region of interest. The candidate structure can include any tower, utility tower, light tower, telecommunications tower, surveillance tower, water tower, a wall or a rooftop of a building, a traffic signal post, a wind turbine, or any other elevated structure. The method can include the candidate coverage function identifying a plurality of tower structures that can be turned into monitoring stations with mounted camera systems. The tower structures can have respective coverage areas based on the visibility from the vantage point of the camera systems, given the topography of the surrounding of the tower structures (e.g., candidate structures). The respective coverage areas can differ from a candidate structure to the candidate structure based on the topography data of the surrounding of each of the candidate structures.

The respective coverage areas can at least partly overlap with the one or more locations of the one or more assets. The respective coverage areas can at least partly overlap with each other. For instance, a first candidate structure having a topographical coverage area (e.g., area of visibility from the first camera system of the first candidate structure) that at least partly overlaps with a second coverage area of the second coverage structure, based on the visibility form the second camera system of the second candidate structure. The coverage areas can include one or more assets to monitor, as well as one or more other candidate structures.

The method can include the structure coverage function identifying, from a plurality of the candidate structures, a candidate structure having a base of the candidate structure located at an elevation and a height of the candidate structure. The height of the candidate structure can be the height from the base of the candidate structure to the location at which to mount a camera system of the camera systems to monitor an asset of the one or more assets. The structure coverage function can identify elevations of other topographical features in the vicinity of the candidate structure. The height and the elevation can be used as data on the structure to determine the coverage structure of this candidate structure, as well as the candidate coverages involving this candidate structure.

The method can include the structure coverage function verifying the one or more assets and the one or more locations of the candidate structures using one or more data sources. The one or more data sources can include at least one of: a satellite data, a map, a video, data on the one or more assets, licensing information and a result from an internet search corresponding to the region of interest. The assets can include power stations, industrial facilities, data centers, corporate or office buildings, residential structures, infrastructure (e.g., airports, train stations, bridges or dams), natural resources (e.g., forests or water bodies), public spaces (e.g., parks), cultural or heritage sites or agricultural fields.

The method can include the data processing system receiving a request to determine the selected coverage based on a subset of the candidate structures and one or more constraints. The request can be a request to determine the selected coverage or the structure set (e.g., set of candidate structures to provide the selected or preferred coverage) based on a particular one or more criteria or constraints.

At 810, the data processing system can determine coverage areas of the candidate structures. The data processing system can also implement a simulation of candidate coverages and determine the coverage areas of candidate structures based on the simulation. For instance, the method can include the structure coverage function determining, based on locations of the candidate structures input into a topography model of the region of interest, one or more respective coverage areas associated with each of the candidate structures. For example, the structure coverage function can utilize any topography data (e.g., region data, camera data, asset data or structures data) as inputs to the topography model of the region. Using the topography model, the structure coverage function can determine respective coverage areas for each of the candidate structure. The coverage areas can vary based on the topography of the area of, or surrounding, the structure, as well as based on any obstructing objects or items.

For instance, the method can include the structure coverage function determining a coverage area of the candidate structure based on a location of the candidate structure, the elevation, and the height (e.g., between the base of the structure and the location at which camera system is to be mounted), input into the topography model. The method can include the structure coverage function determining, using the topography model and elevations of the locations of the candidate structures, the respective coverage areas as captured by the camera systems mounted on each of the candidate structures.

For example, the topography model can account for any changes in the topography (e.g., elevation, intervening structures or limitations to the field of view of the camera systems) to determine, compute or calculate the distance of the visibility between the candidate structure location along each of the 360 degrees around the candidate structure. In doing so, the topography model can determine the structure coverage that spans 360 degree around the candidate structure, accounting for any variations in the topography (e.g., elevation changes) or intervening structures (e.g., buildings, hills or trees) that can obstruct the visibility from the candidate structure. In doing so, the topography model allows for a more accurate, more realistic and more reliable determination of the structure coverage for each candidate structure.

At 815, the data processing system can simulate candidate coverages for the candidate structures. The method can include the data processing system utilizing the coverage simulator to execute a simulation using the respective coverage areas of any combination of (e.g., one or more or each of) the candidate structures. By executing the simulation of the respective coverage areas, the coverage simulator can determine, generate or compute a plurality of combined candidate coverages of the one or more assets. For instance, the coverage simulator can combine any subset of the plurality of candidate structures to determine their combined coverage of the region and their coverage with respect to any one or more assets, which can have varying levels of priority or importance (e.g., based on the criteria or constraints).

The method can include the coverage simulator executing the simulation using the coverage area of the candidate structure determined based on any one or more topography data input into the model. For instance, the coverage simulator can simulate the combined coverage area of a plurality of candidate structures using topography data, such as the location of the candidate structure, the elevation at which the candidate structure is located, and the height from the base of the candidate structure to the location at which the camera system is to be mounted, any of which can be input into the topography model.

The method can include the coverage simulator identifying and using one or more constraints or one or more criteria for determining candidate structures. The one or more constraints can include or correspond to at least one of: a maximum number of structures to include in the set of structures, a location of a structure of the set of structures or a threshold value for the candidate coverage by the set of structures. The criteria can include one or more of: a prioritization of an area or assets to cover, a number of structures in the set of structures, locations of the candidate structures, a number of the one or more assets, locations of the one or more assets, one or more portions of the region of interest, fire hazard prioritization, one or more locations associated with a fire hazard, density of population prioritization or one or more locations associated with a population density within the region of interest. The criteria can include information for prioritizing features over others (e.g., parameter weights for prioritizing features of topography data over others), whereas constraints can indicate limitations to the determinations.

The coverage simulator can generate a plurality of candidate sets of structures for which to evaluate the plurality of candidate coverages. Each candidate set of structures can include a different subset of the candidate structures that can be selected based on any one or more of the criteria or the constraints. For instance, candidate coverages can be determined based on a set number limitation for the candidate structures to use, prioritizations for various asset types or specific assets identified, prioritization for particular areas in which to identify structures, prioritization for regions corresponding to particular population density or particular level of fire hazards.

At 820, the data processing system can select a structure set for a selected coverage. The method can include the structure selector 150 selecting, from the plurality of candidate structures (e.g., various combinations of combined candidate coverages of various sets of candidate structures), a particular set of structures corresponding to a particular selected coverage. The structure selector can select the structures set, based on the simulation by the coverage simulator and based a set of criteria. The set of coverages can correspond to a particular selected candidate coverage from the plurality of candidate coverages generated by the coverage simulator.

The structure selector can select the set of structures based on the selection of a particular candidate coverage as the selected coverage. For instance, the structure selector can identify a particular candidate coverage to have a most optimal coverage of the assets or areas based on the criteria. The criteria can include a prioritization for a maximum amount of area to cover with a set number of candidate structures. The structure selector can select a given candidate coverage as the selected coverage based on a determination that the selected candidate coverage includes the largest coverage area of all candidate coverages for the given number of candidate structures.

The structure selector can select the set of structures based on a set of criteria. The set of criteria can include one or more of: a prioritization of an area or particular assets (e.g., to maximize or prioritize), a number of structures in the set of structures, locations of the candidate structures, a number of the one or more assets, locations of the one or more assets, one or more portions of the region of interest, one or more locations with associated with a fire hazard or one or more locations associated with a population density within the region of interest. The criteria can include, for example, prioritization of particular assets to cover from a minimum number of different angles or directions. Based on any such combination of criteria or constraints, the structure selector can select the given set of structures to maximize the prioritization according to the criteria in view of the constraint limitations.

For instance, the method can include the structure selector selecting, from the plurality of tower structures, the set of structures based at least on an amount of overlap between each of the set of structures and the one or more locations. For example, the structure selector can select, based on the simulation of the plurality of candidate sets of structures, the set of structures corresponding to the selected coverage (e.g., coverage based on one or more constraints).

The method can include the structure selector creating or generating outputs based on the structure sets or selected coverage. For example, the structure selector can generate or produce the coverage data for transmission for presentation (e.g., to a remote client device) according to the subset of the candidate structures and the one or more constraints selected. The structure selector can compute a score corresponding to an amount of area of the one or more assets covered by the selected coverage, corresponding to the number of assets covered, or based on meeting or satisfying any combination of criteria and constraints. The structure selector can transmit such coverage data (e.g., structure sets, selected coverage or scores) for presentation via the interface.

At 825, the data processing system can transmit data for presentation. The data processing system can include the interface transmitting, for presentation, coverage data representing the set of structures and the respective coverage areas associated with each of the structures of the set of structures forming the selected coverage. The interface can transmit the coverage data for presentation via a display of the data processing system or for a display on a remote client device (e.g., by transmitting the coverage data via a network).

The coverage data to be transmitted for presentation via a user interface can include a map of the region of interest. The map can indicate or identify one or more locations of the set of structures and the selected coverage to be displayed via the user interface. The map can identify one or more assets, and the individual structure coverages of the individual structures of the set of structures. The map can include any topography data, such as data of camera systems, assets, structures or region.

The coverage data to be transmitted for presentation can include a table that can reference information on the set of structures and information on the selected coverage. The table can include information or data on each of the structures of the set of structures, each structure coverage of each of the structures of the set, any information on the assets and how they are covered or any other information corresponding to the topography data.

The interface can generate the coverage data for transmission (e.g., individually or together with the structure selector), such that the coverage data can be presented for display according to the subset of the candidate structures and the one or more constraints. For instance, the coverage data can be provided responsive to a request received at 805 and the coverage data can be generated according to the constraints or criteria of the request. The coverage data can be formatted for display by the client device.

The interface can overlay, onto a map of the region of interest displayed in a user interface, the coverage data. The overlaid coverage data can represent or indicate the set of structures, the one or more assets and at least one of a fire hazard distribution within the region of interest or a population density distribution within the region of interest. The map can indicate the density of the population, the fire hazard density or probability per unit area, the assets in the region or any other data.

The foregoing examples have been provided merely for the purpose of explanation and are in no way to be construed as limiting of the present disclosure. While aspects of the present disclosure have been described with reference to an exemplary embodiment, it is understood that the words which have been used herein are words of description and illustration, rather than words of limitation. Changes may be made, within the purview of the appended claims, as presently stated and as amended, without departing from the scope and spirit of the present disclosure in its aspects. Although aspects of the present disclosure have been described herein with reference to particular means, materials and embodiments, the present disclosure is not intended to be limited to the particulars disclosed herein; rather, the present disclosure extends to all functionally equivalent structures, methods and uses, such as are within the scope of the appended claims.

The systems described above can provide multiple ones of any or each of those components and these components can be provided on either a standalone system or on multiple instantiation in a distributed system. In addition, the systems and methods described above can be provided as one or more computer-readable programs or executable instructions embodied on or in one or more articles of manufacture. The article of manufacture can be cloud storage, a hard disk, a CD-ROM, a flash memory card, a PROM, a RAM, a ROM, or a magnetic tape. In general, the computer-readable programs can be implemented in any programming language, such as LISP, PERL, C, C++, C #, PROLOG, or in any byte code language such as JAVA. The software programs or executable instructions can be stored on or in one or more articles of manufacture as object code.

The subject matter and the operations described in this specification can be implemented in digital electronic circuitry, or in computer software, firmware, or hardware, including the structures disclosed in this specification and their structural equivalents, or in combinations of one or more of them. The subject matter described in this specification can be implemented as one or more computer programs, e.g., one or more circuits of computer program instructions, encoded on one or more computer storage media for execution by, or to control the operation of, data processing apparatuses. Alternatively, or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. While a computer storage medium is not a propagated signal, a computer storage medium can be a source or destination of computer program instructions encoded in an artificially generated propagated signal. The computer storage medium can also be, or be included in, one or more separate components or media (e.g., multiple CDs, disks, or other storage devices include cloud storage). The operations described in this specification can be implemented as operations performed by a data processing apparatus on data stored on one or more computer-readable storage devices or received from other sources.

The terms "computing device", "component" or "data processing apparatus" or the like encompass various apparatuses, devices, and machines for processing data, including by way of example a programmable processor, a computer, a system on a chip, or multiple ones, or combinations of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, app, script, or code) can be written in any form of programming language, including compiled or interpreted languages, declarative or procedural languages, and can be deployed in any form, including as a stand-alone program or as a module, component, subroutine, object, or other unit suitable for use in a computing environment. A computer program can correspond to a file in a file system. A computer program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatuses can also be implemented as, special purpose logic circuitry, e.g., an FPGA (field programmable gate array) or an ASIC (application specific integrated circuit). Devices suitable for storing computer program instructions and data can include non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The subject matter described herein can be implemented in a computing system that includes a back end component, e.g., as a data server, or that includes a middleware component, e.g., an application server, or that includes a front end component, e.g., a client computer having a graphical user interface or a web browser through which a user can interact with an implementation of the subject matter described in this specification, or a combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While operations are depicted in the drawings in a particular order, such operations are not required to be performed in the particular order shown or in sequential order, and all illustrated operations are not required to be performed. Actions described herein can be performed in a different order.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence has any limiting effect on the scope of any claim elements.

Modifications of described elements and acts such as substitutions, changes and omissions can be made in the design, operating conditions and arrangement of the disclosed elements and operations without departing from the scope of the present disclosure.

References to "approximately," "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. A system comprising:

one or more processors coupled with memory to:

identify a plurality of candidate structures on which to mount a plurality of camera systems to monitor one or more assets in a region of interest;

determine, based on locations of the plurality of candidate structures input into a topography model of the region of interest, for each candidate structure, a respective coverage area corresponding to fields-of-view of one or more camera systems associated with the candidate structure;

execute a simulation using the respective coverage area associated with each candidate structure to determine a plurality of candidate coverages of the one or more assets in the region of interest, wherein to execute the simulation, the one or more processors are configured to i) identify one or more constraints for each candidate set of structures, the one or more constraints corresponding to at least one of: a maximum number of structures to include in the candidate set of structures, a location of a structure of the candidate set of structures or a threshold value for the candidate coverage associated with the candidate set of structures;

ii) generate a plurality of candidate sets of structures for which to evaluate the plurality of candidate coverages, each candidate set of structures including a different subset of the candidate structures; and iii) select, from the plurality of candidate set of structures, based on the simulation and a set of criteria, a set of structures corresponding to a selected coverage of the plurality of candidate coverages; and transmit, for presentation, data representing the set of structures and the respective coverage areas associated with each of the structures of the set of structures forming the selected coverage.

2. The system of claim 1, comprising the one or more processors to:

identify, from the plurality of candidate structures, a subset of the plurality of candidate structures having respective coverage areas that at least partly overlap with the one or more locations of the one or more assets; and select, from the subset, the set of structures based at least on an amount of overlap between each of the set of structures and the one or more locations.

3. The system of claim 1, comprising the one or more processors to:

identify, from the plurality of candidate structures, i) a candidate structure having a base of the candidate structure located at an elevation and ii) a height of the candidate structure, above the base, at which to mount a camera system of the camera systems to monitor an asset of the one or more assets;

determine a coverage area of the candidate structure based on a location of the candidate structure, the elevation, and the height input into the topography model; and execute the simulation using the coverage area of the candidate structure.

4. The system of claim 1, comprising the one or more processors to:

verify the one or more assets and the one or more locations of the plurality of candidate structures using one or more data sources, the one or more data sources including at least one of: a satellite data, a map, a video, data on the one or more assets, licensing information and a result from an internet search corresponding to the region of interest.

5. The system of claim 1, comprising the one or more processors to:

determine, using the topography model and elevations of the locations of the plurality of candidate structures, the respective coverage areas as captured by the camera systems mounted on each of the candidate structures.

6. The system of claim 1, wherein the data to be transmitted for presentation via a user interface includes a map of the region of interest, the map identifying one or more locations of the set of structures and the selected coverage to be displayed via the user interface.

7. The system of claim 1, wherein the data to be transmitted for presentation includes a table referencing information on the set of structures and information on the selected coverage.

8. The system of claim 1, comprising the one or more processors to:

receive a request to determine the selected coverage based on a subset of the candidate structures and one or more constraints; and generate the data for transmission for presentation according to the subset of the candidate structures and the one or more constraints.

9. The system of claim 1, wherein the set of criteria includes one or more of: a number of structures in the set of structures, locations of the candidate structures, a number of the one or more assets, locations of the one or more assets, one or more portions of the region of interest, one or more locations associated with a fire hazard or one or more locations associated with a population density within the region of interest.

10. The system of claim 1, comprising the one or more processors to:

compute a score corresponding to an amount of area of the one or more assets covered by the selected coverage; and transmit, for presentation, the score.

11. The system of claim 1, comprising the one or more processors to:

overlay, onto a map of the region of interest displayed in a user interface, the data representing the set of structures, the one or more assets and at least one of a fire hazard distribution within the region of interest or a population density distribution within the region of interest.

12. A method, comprising identifying, by one or more processors coupled with memory, a plurality of candidate structures on which to mount a plurality of camera systems to monitor one or more assets in a region of interest;

determining, by the one or more processors, based on locations of the plurality of candidate structures input into a topography model of the region of interest, for each candidate structure, a respective coverage area corresponding to fields-of-view of one or more camera systems associated with the candidate structure;

executing, by the one or more processors, a simulation using the respective coverage area associated with each candidate structure to determine a plurality of candidate coverages of the one or more assets in the region of interest, wherein executing the simulation includes:

i) identifying one or more constraints for each candidate set of structures, the one or more constraints corresponding to at least one of: a maximum number of structures to include in the candidate set of structures, a location of a structure of the candidate set of structures or a threshold value for the candidate coverage associated with the candidate set of structures;

ii) generating a plurality of candidate sets of structures for which to evaluate the plurality of candidate coverages, each candidate set of structures including a different subset of the candidate structures; and iii) selecting, by the one or more processors, from the plurality of candidate set of structures, based on the simulation and a set of criteria, a set of structures corresponding to a selected coverage of the plurality of candidate coverages; and transmitting, by the one or more processors, for presentation, data representing the set of structures and the respective coverage areas associated with each of the structures of the set of structures forming the selected coverage.

13. The method of claim 12, comprising:

identifying, by the one or more processors, from the plurality of candidate structures, a subset of the plurality of candidate structures having respective coverage areas that at least partly overlap with the one or more locations of the one or more assets; and selecting, by the one or more processors, from the subset, the set of structures based at least on an amount of overlap between each of the set of structures and the one or more locations.

14. The method of claim 12, comprising:

identifying, by the one or more processors, from the plurality of candidate structures, i) a candidate structure having a base of the candidate structure located at an elevation and ii) a height of the candidate structure, above the base, at which to mount a camera system of the camera systems to monitor an asset of the one or more assets;

determining, by the one or more processors, a coverage area of the candidate structure based on a location of the candidate structure, the elevation, and the height input into the topography model; and executing, by the one or more processors, the simulation using the coverage area of the candidate structure.

15. The method of claim 12, comprising:

verifying, by the one or more processors, the one or more assets and the one or more locations of the plurality of candidate structures using one or more data sources, the one or more data sources including at least one of: a satellite data, a map, a video, data on the one or more assets, licensing information and a result from an internet search corresponding to the region of interest.

16. The method of claim 12, comprising:

receiving, by the one or more processors, a request to determine the selected coverage based on a subset of the candidate structures and one or more constraints; and generating, by the one or more processors, the data for transmission for presentation according to the subset of the candidate structures and the one or more constraints.

17. The method of claim 12, comprising:

identifying, by the one or more processors, one or more constraints for the set of structures, the one or more constraints corresponding to at least one of: a maximum number of structures to include in the set of structures, a location of a structure of the set of structures or a threshold value for the candidate coverage by the set of structures;

generating, by the one or more processors, a plurality of candidate sets of structures for which to evaluate the plurality of candidate coverages, each candidate set of structures including a different subset of the candidate structures; and selecting, by the one or more processors, based on the simulation of the plurality of candidate sets of structures, the set of structures corresponding to the selected coverage.

18. A non-transitory computer readable medium storing instructions that, when executed by one or more processors, cause the one or more processors to:

identify a plurality of candidate structures on which to mount a plurality of camera systems to monitor one or more assets in a region of interest;

determine, based on locations of the plurality of candidate structures input into a topography model of the region of interest, for each candidate structure, a respective coverage area corresponding to fields-of-view of one or more camera systems associated with the candidate structure;

execute a simulation using the respective coverage area associated with each candidate structure to determine a plurality of candidate coverages of the one or more assets in the region of interest, wherein to execute the simulation, the one or more processors are configured to i) identify one or more constraints for each candidate set of structures, the one or more constraints corresponding to at least one of: a maximum number of structures to include in the candidate set of structures, a location of a structure of the candidate set of structures or a threshold value for the candidate coverage associated with the candidate set of structures;

ii) generate a plurality of candidate sets of structures for which to evaluate the plurality of candidate coverages, each candidate set of structures including a different subset of the candidate structures; and iii) select, from the plurality of candidate set of structures, based on the simulation and a set of criteria, a set of structures corresponding to a selected coverage of the plurality of candidate coverages; and transmit, for presentation, data representing the set of structures and the respective coverage areas associated with each of the structures of the set of structures forming the selected coverage.

19. The non-transitory computer readable medium of claim 18, wherein the instructions, when executed by the one or more processors, cause the one or more processors to:

identify, from the plurality of candidate structures, a subset of the plurality of candidate structures having respective coverage areas that at least partly overlap with the one or more locations of the one or more assets; and select, from the subset, the set of structures based at least on an amount of overlap between each of the set of structures and the one or more locations.

* * * * *